(12) United States Patent
Lo

(10) Patent No.: US 10,405,441 B1
(45) Date of Patent: Sep. 3, 2019

(54) ELECTRONIC DEVICE HAVING BUFFERING POSITIONING MECHANISM

(71) Applicant: Getac Technology Corporation, Hsinchu County (TW)

(72) Inventor: Chi-Chen Lo, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 16/167,906

(22) Filed: Oct. 23, 2018

(51) Int. Cl.
*H05K 5/02* (2006.01)

(52) U.S. Cl.
CPC .................................. *H05K 5/0217* (2013.01)

(58) Field of Classification Search
CPC ..................................................... H05K 5/0217
See application file for complete search history.

(56) References Cited

U.S. PATENT DOCUMENTS

| | | | | |
|---|---|---|---|---|
| 6,222,121 B1 * | 4/2001 | Cheng | ................... | G11B 33/08 |
| | | | | 174/544 |
| 7,009,835 B2 * | 3/2006 | Desai | ................... | G11B 33/08 |
| | | | | 248/633 |
| 7,012,805 B2 * | 3/2006 | Shah | ...................... | G11B 33/08 |
| | | | | 248/634 |
| 8,218,310 B2 * | 7/2012 | Ou | ........................ | G11B 33/124 |
| | | | | 312/223.2 |
| 9,256,252 B2 * | 2/2016 | Chao | .................... | H04B 1/3888 |
| 2003/0011980 A1 * | 1/2003 | Albrecht | ................. | G06F 1/184 |
| | | | | 361/679.34 |
| 2006/0181845 A1 * | 8/2006 | Shah | ...................... | G11B 33/12 |
| | | | | 361/679.4 |
| 2013/0286552 A1 * | 10/2013 | Wei | ...................... | H04B 1/3888 |
| | | | | 361/679.01 |
| 2017/0171989 A1 * | 6/2017 | Kim | ....................... | G06F 3/041 |

* cited by examiner

*Primary Examiner* — Lisa Lea-Edmonds
(74) *Attorney, Agent, or Firm* — Tim Tingkang Xia, Esq.; Locke Lord LLP

(57) ABSTRACT

An electronic device having a buffering positioning mechanism includes a casing, an internal module and at least one buffer member. The casing includes two shells. Internal components of the electronic device are all provided on a carrier and are assembled to form the internal module. The internal module is accommodated in the casing, and is fixed to the casing without using any fixing elements. The buffer member fills and supports between an inner wall of the casing and an outer wall of the internal module, wherein the inner wall and the outer wall are opposite each other. Thus, collision resistance and fall resistance as well as an effect of fixing the internal module in the casing without using any fixing elements are achieved.

18 Claims, 3 Drawing Sheets

ELECTRONIC DEVICE HAVING BUFFERING POSITIONING MECHANISM

BACKGROUND OF THE INVENTION

Field of the Invention

The present invention relates to electronic devices and, more particularly, to an electronic device having a buffering positioning mechanism.

Description of the Prior Art

An electronic device primarily includes a casing and multiple internal components (such as circuit boards and connectors) accommodated in the casing. The casing includes a base and a cover mutually assembled. A recessed space is formed in the base, and a plurality of fixing columns is protruding provided at an inner surface of the base. The internal components are fixed at the inner surface of the base in a manner that a plurality of first screw elements respectively corresponds to the fixing columns by means of screw coupling. The cover corresponds to the recessed space and covers the base, and is fixed at the base by a plurality of second screw elements.

However, because all of the internal components are fixed on the multiple fixing columns, once the electronic device encounters a collision or falling, the fixing columns receive all energy generated from the collision or falling and are inevitably broken—such does not satisfy the requirement of collision resistance and fall resistance for modern products.

Furthermore, while a current electronic device is in production, all of the internal components are fixed on the base, in a way that the base in the casing needs to be placed on a production line for an assembly process at the beginning, thus increasing the probability of damage of the base caused by impact or scratching. Since users dot not purchase a product with an impaired casing, the product is regarded as defective and is discarded once the casing is impaired, resulting in waste.

SUMMARY OF THE INVENTION

It is an object of the present invention to provide an electronic device having a buffering positioning mechanism.

To achieve the above object, an electronic device having a buffering positioning mechanism is provided according to an embodiment of the present invention. The electronic device includes a casing, having two inner walls opposite each other; an internal module, having two outer walls opposite each other, including a carrier and a plurality of internal components of the electronic device that are provided on the carrier, the internal module accommodated in the casing and fixed at the casing without using any fixing elements; and at least one buffer member, supporting between at least one of the inner walls and at least one of the outer walls opposite each other.

An electronic device having a buffering positioning mechanism is further provided according to another embodiment of the present invention. The electronic device includes a casing, including two shells fixed by at least one fixing element only between the two shells, the two shells respectively having two inner walls opposite each other; an internal module, having two outer walls opposite each other, including a carrier and a plurality of internal components of the electronic device that are provided on the carrier, the internal module accommodated in the casing; and at least one buffer member, supporting between at least one of the inner walls and at least one of the outer walls opposite each other.

In conclusion, the electronic device having a buffering positioning mechanism according to the embodiments of the present invention at least provides the following effects: the internal module can be buffered and positioned at a predetermined position in the casing, thus providing collision resistance and fall resistance as well as an effect of fixing the internal module at the casing without using any fixing elements.

DETAILED DESCRIPTION OF THE EMBODIMENTS

Details and technical contents of the present invention are provided in conjunction with the accompanying drawings below. However, it should be noted that the accompanying drawings are only for reference and illustration purposes and are not to be construed as limitations to the present invention.

Figure 1:
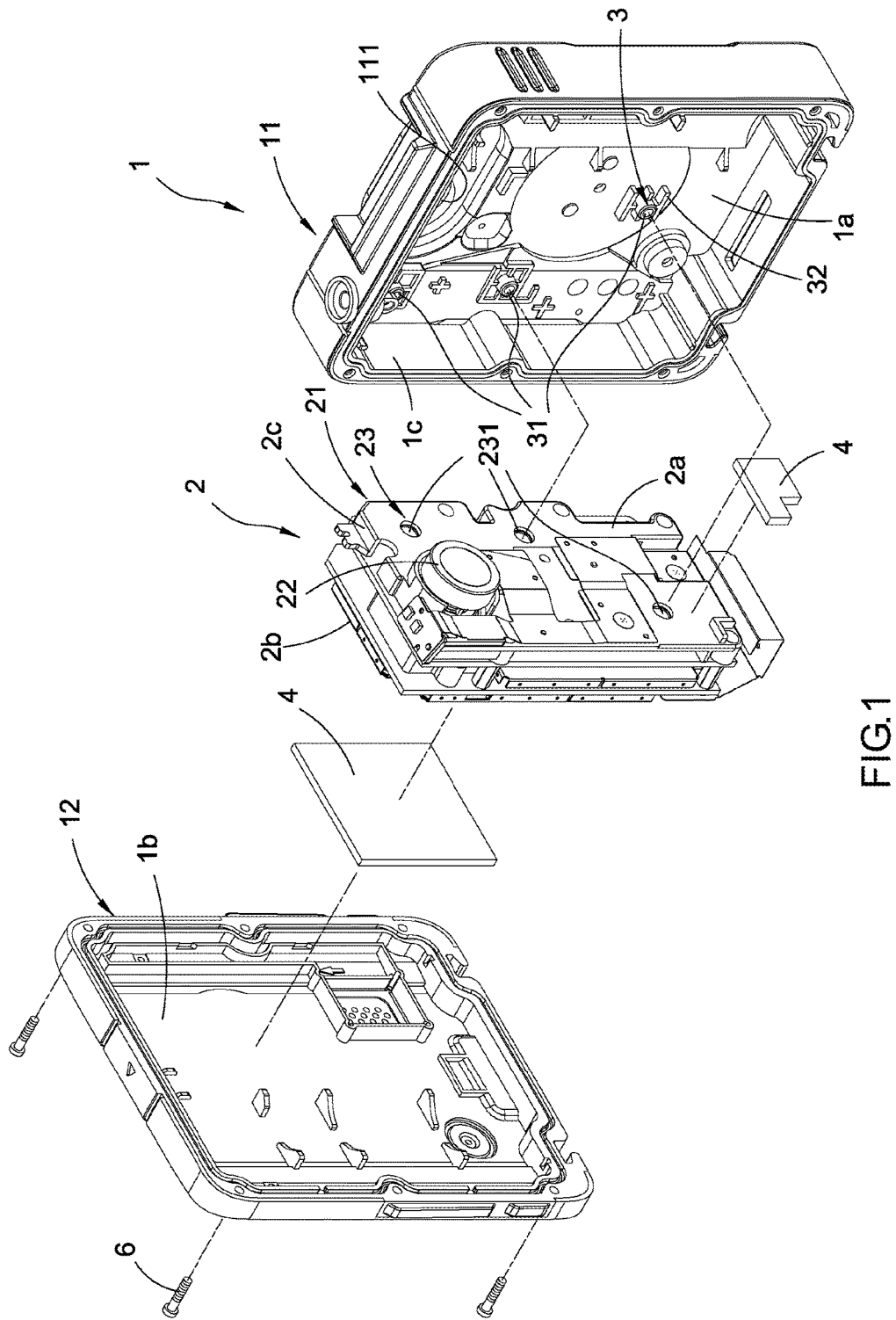
FIG. 1 is an exploded perspective view of an electronic device according to an embodiment of the present invention.
Figure 2:
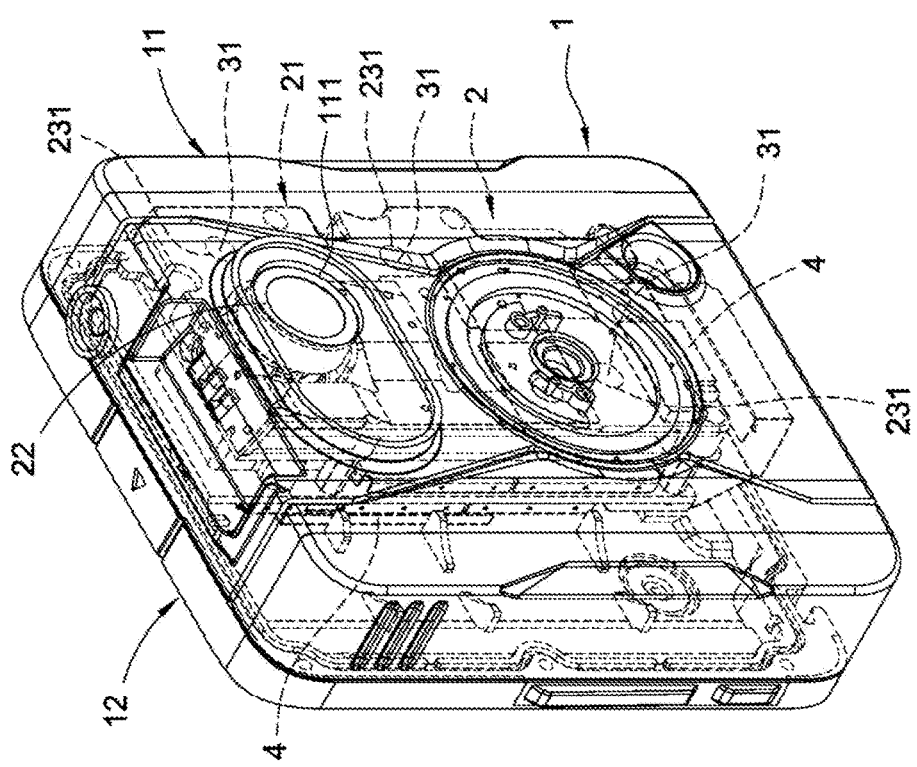
FIG. 2 is an assembled perspective view of an electronic device according to an embodiment of the present invention.
Figure 3:
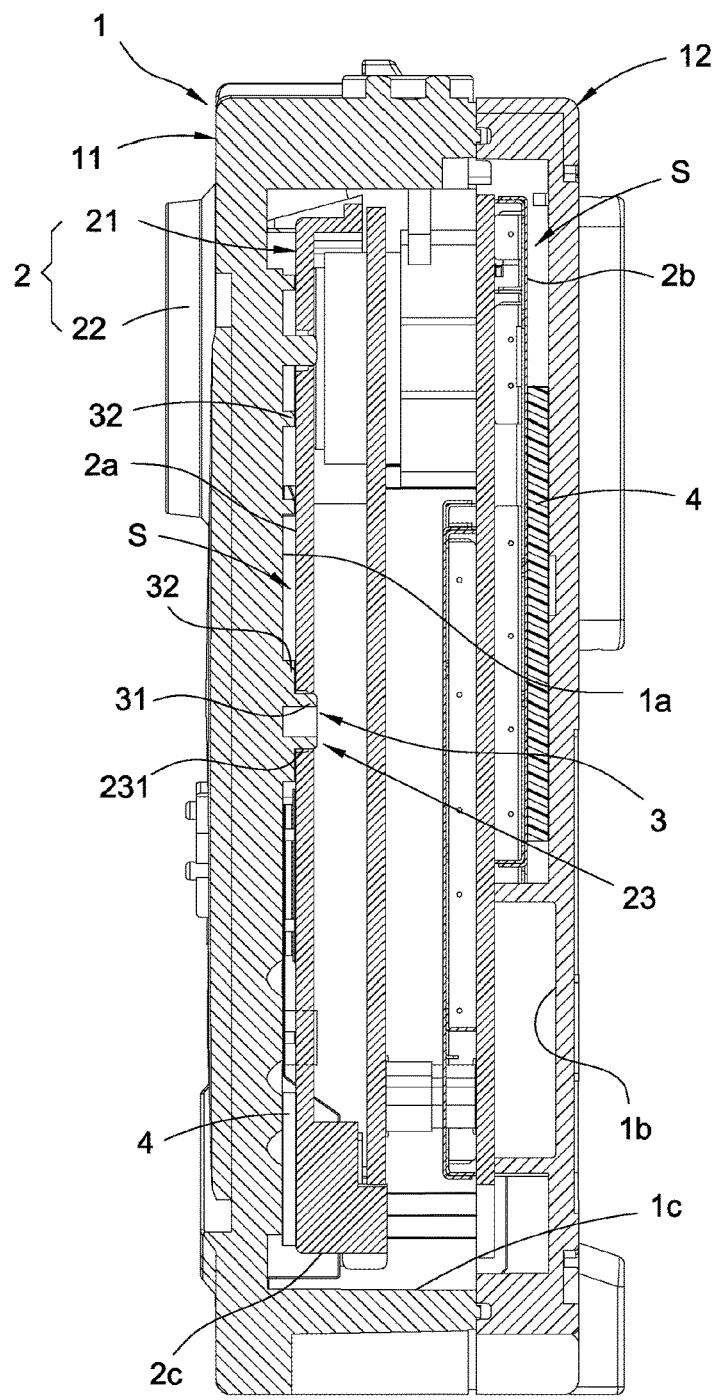
FIG. 3 is a sectional view of an electronic device according to an embodiment of the present invention.

As shown in FIG. 1 to FIG. 3, an electronic device having a buffering positioning mechanism according to an embodiment of the present invention includes a casing 1, an internal module 2 and at least one buffer member 4, and preferably further includes a positioning structure 3.

The casing 1 may be a two-piece structure having two shells. As shown in the figures, the casing 1 includes a first shell 11 and a second shell 12 that can be mutually assembled. For assembly, the second shell 12 is fixed on the first shell 11 by at least one fixing element 6. The fixing element 6 may be in a quantity of one or plural.

The casing 1 has two inner walls opposite each other, and the two inner walls include a first inner wall 1a and a second inner wall 1b, preferably further include an inner surrounding wall 1c connecting between a periphery of the first inner wall 1a and a periphery of the second inner wall 1b. The first inner wall 1a and the second inner wall 1b respectively belong to the first shell 11 and the second shell 12. The inner surrounding wall 1c may belong to the first shell 11 or the second shell 12. As shown in FIG. 1, the inner surrounding wall 1c belongs to the first shell 11.

The internal module 2 includes a carrier 21 and a plurality of internal components (not indicated by denotations). In other words, these internal components are all provided on the carrier 21 and are assembled to form the internal module 2. The internal components are components of the electronic device that are accommodated in the casing 1, and include, for example, circuit boards and connectors (not indicated by denotations), and preferably further include a predetermined exposed component 22.

The internal module 2 has two outer walls opposite each other, and the two outer walls include a first outer wall 2a and a second outer wall 2b, and preferably further include an outer surrounding wall 2c connecting between a periphery of the first outer wall 2a and a periphery of the second outer wall 2b. The inner surrounding wall 1c and the outer surrounding wall 2c are arranged in opposite at an interval.

The buffer member 4 may be any object or article having a buffering function, such as silicone or foam sponge, and is exemplified by a foam sponge in this embodiment for illustration.

The internal module 2 is accommodated in the casing 1, and at least one buffer member 4 fills and supports between at least one of the inner walls and at least one of the outer walls opposite each other at an interval, e.g., fills and supports between the first inner wall 1a and the first outer wall 2a, or fills and supports between the second inner wall 1b and the second outer wall 2b. Moreover, when the buffer member 4 fills and supports between one of the inner walls and one of the outer walls (e.g., the second inner wall 1b and the second outer wall 2b), the other outer wall of the internal module 2 abuts against the other inner wall of the casing 1 (e.g., the first outer wall 2a abuts against the first inner wall 1a), so as to buffer and position the internal module 2 at a predetermined position in the casing 1.

In this embodiment, two buffer members 4 respectively filling and tightly supporting between the first inner wall 1a and the first outer wall 2a and between the second inner wall 1b and the second outer wall 2b are taken as an example. Thus, with the buffer members 4 respectively filling and supporting between the two outer walls of the internal module 2 and the two inner walls of the casing 1, the internal module 2 can be buffered and positioned at the predetermined position in the casing 1; that is, in addition to positioning the internal module 2 in the casing 1, the internal module 2 is further provided with a buffering effect when it moves relative to the casing 1.

The positioning structure 3 can be provided at any inner wall of the casing 1. In this embodiment, the positioning structure 3 is provided at the first inner wall 1a. The electronic device in the embodiment of the present invention is, at the first outer wall 2a of the internal module 2, further provided with a corresponding positioning structure 23 corresponding to the positioning structure 3. Thus, as shown in FIG. 3, with the corresponding coupling of the positioning structure 3 and the corresponding positioning structure 23, the internal module 2 can be precisely positioned at the predetermined position in the casing 1.

The present invention does not specifically define the structures and shapes of the positioning structure 3 and the corresponding positioning structure 23. In this embodiment, the positioning structure 3 and the corresponding positioning structure 23 respectively include at least two positioning columns 31 and at least two positioning holes 231, for example. Furthermore, the positioning columns 31 are correspondingly inserted into the positioning holes 231 to achieve the required precise positioning.

More specifically, as shown in FIG. 1 and FIG. 3, the positioning columns 31 of the positioning structure 3 protrude from the first inner wall 1a towards a direction of the first outer wall 2a, and the positioning holes 231 of the corresponding positioning structure 23 are recessed from the first outer wall 2a towards the same direction. Thus, when the positioning columns 31 are correspondingly inserted into the positioning holes 231, the internal module 2 can be precisely positioned at a length position (equivalent to the X-axis) and a width position (equivalent to the Y-axis) of the casing 1, thereby precisely exposing the predetermined exposed component 22 of the internal module 2 through an opening 111 of the casing 1. In other words, given that the internal module 2 is positioned at a predetermined position in the casing 1 by the positioning structure 3 and the corresponding positioning structure 23, the predetermined exposed component 22 can be precisely exposed through the opening 111.

Preferably, the positioning structure 3 may further include at least one positioning rib 32. The positioning rib 32 may be in a quantity of one or plural. As shown in FIG. 1, the positioning rib 32 is in a quantity of three as an example for illustration. As shown in FIG. 1 and FIG. 3, the positioning ribs 32 respectively protrude from the first inner wall 1a towards a direction of the first outer wall 2a by a predetermined protruding length (not indicated by a denotation), such that the positioning ribs 32 can abut against the first outer wall 2a of the internal module 2 by the predetermined protruding length. Thus, the internal module 2 is positioned at a height position (equivalent to the Z-axis) of the casing 1, and the predetermined exposed component 22 protrudes from the casing 1 by a predetermined protruding length. Apart from being independently protruding from the first inner wall 1a, the positioning ribs 32 may also be combined with outer peripheries of the positioning columns 31, so as to reinforce the structural strength between the positioning columns 31 and the casing 1.

In other embodiments not depicted by the drawings, referring to FIG. 3, an interval space S is respectively formed between the first inner wall 1a of the casing 1 and the elevated and recessed first outer wall 2a of the internal module 2, and between the second inner wall 1b of the casing 1 and the elevated and recessed second outer wall 2b of the internal module 2. The shapes of the two buffer members 4 are respectively corresponding to the shapes of the two interval spaces S. Thus, when the two buffer members 4 respectively fill and support in the two interval spaces S, the two buffer members 4 at the same time provide buffering and precise positioning effects, thereby omitting the foregoing positioning structure 3 and corresponding positioning structure 23.

In some embodiments, the electronic device may be, for example, a portable camera device, a smartphone or a tablet computer, and the portable camera device is, for example, a secret recorder installed on a garment, a wearable camera, a portable video recorder or a miniature camera. The predetermined exposed component 22 is, for example, a camera lens, a key, a knob or a light. The above examples are for illustration purposes and are not to be construed as limitations to the present invention.

In conclusion, the electronic device having a buffering positioning mechanism according to the embodiment of the present invention at least provides the following effects: all of the internal components of the electronic device are provided on the carrier 21 and are assembled to form the internal module 2, and the buffer member 4 fills and supports between the inner wall of the casing 1 and the outer wall of the internal module 2, so as to buffer and position the internal module 2 at a predetermined position in the casing 1. Thus, effects of collision resistance and fall resistance are provided, and an effect of fixing the internal module 2 at the casing 1 without using any fixing elements (or requiring only the fixing element 6 between the first shell 11 and the second shell 12) is also achieved. As such, when the electronic device in the embodiment of the present invention encounters a collision or falling, because all displacement energy generated from the collision or falling is absorbed and buffered by the buffer member 4, the internal module 2 is not damaged by the collision or falling, hence providing collision resistance and falling resistance. Furthermore, as the internal module 2 can be positioned in the casing 1 by the buffer member 4, the internal module 2 can be fixed at the casing 1 without using any fixing elements, which is equivalently avoiding the situation of having to discard the casing 1 when the fixing columns of a current electronic device are broken due to a collision or falling.

Moreover, by providing all of the internal components of the electronic device on the carrier 21 and fixing the internal module 2 at the casing 1 without using any fixing elements, the casing 1 is needed only in the last step for accommodating the internal module 2 on a production line. As a result, the time of the presence of the casing 1 on the production line is noticeably reduced, thereby significantly lowering the probability of damaging the casing 1 by impact or scratching on the production line.

The electronic device in the embodiment of the present invention further provides other effects below. With the positioning structure 3 and the corresponding positioning structure 23, the internal module 2 can be precisely positioned at a predetermined position in the casing 1, hence allowing the predetermined exposed component 22 to be exposed by means of precisely corresponding to the opening 111 of the casing 1.

While the present invention has been described by way of the above preferred embodiments, it is to be understood that the claim scope of the present invention is not limited thereto. Equivalent structural variations made on the basis of the disclosure and drawings of the application of the present invention are to be encompassed in the claim scope of the present invention.

What is claimed is:

1. An electronic device having a buffering positioning mechanism, comprising:
   a casing, having two inner walls opposite each other;
   an internal module, having two outer walls opposite each other, comprising a carrier and a plurality of internal components of the electronic device provided on the carrier, the internal module accommodated in the casing, the internal module fixed to the casing without using any fixing elements; and
   at least one buffer member, supporting between at least one of the inner walls and at least one of the outer walls that are opposite each other;
   wherein the at least one buffer member supports between one of the inner walls and one of the outer walls that are opposite each other, and one other of the outer walls of the internal module abuts against one other of the inner walls of the casing.

2. The electronic device having a buffering positioning mechanism according to claim 1, wherein at least one interval space is formed between the internal module and the casing, a shape of the at least one buffer member corresponds to a shape of the at least one interval space, and the at least one buffer member fills in the at least one interval space.

3. The electronic device having a buffering positioning mechanism according to claim 1, wherein the at least one buffer member is in a quantity of two, and the buffer members respectively support between the inner walls and the outer walls opposite each other.

4. The electronic device having a buffering positioning mechanism according to claim 1, further comprising:
   a positioning structure, provided at one of the inner walls;
   wherein the internal module is provided with a corresponding positioning structure, the positioning structure mutually couples the corresponding positioning structure to position the internal module at a predetermined position in the casing.

5. The electronic device having a buffering positioning mechanism according to claim 4, wherein the positioning structure and the corresponding positioning structure respectively comprise at least two positioning columns and at least two positioning holes, and the positioning columns are correspondingly inserted into the positioning holes.

6. The electronic device having a buffering positioning mechanism according to claim 4, wherein the two inner walls are respectively a first inner wall and a second inner wall, the two outer walls are respectively a first outer wall and a second outer wall, the first inner wall and the first outer wall are opposite each other at an interval, the positioning structure protrudes from the first inner wall towards a direction of the first outer wall, and the corresponding positioning structure is recessed from the first outer wall towards a same direction.

7. The electronic device having a buffering positioning mechanism according to claim 5, wherein the positioning structure further comprises at least one positioning rib, the at least one positioning rib protrudes from the first inner wall towards a direction of the first outer wall by a predetermined protruding length, and the at least one positioning rib abuts against the first outer wall of the internal module by the predetermined protruding length.

8. The electronic device having a buffering positioning mechanism according to claim 4, wherein the plurality of internal components comprises a predetermined exposed component, the casing is provided with an opening, the predetermined exposed component is, through the internal module positioned at the predetermined position in the casing by the positioning structure and the corresponding structure, exposed through the opening.

9. The electronic device having a buffering positioning mechanism according to claim 1, wherein the casing further comprises an inner surrounding wall connecting between peripheries of the two inner walls, the internal module further comprises an outer surrounding wall connecting between peripheries of the two outer walls, and the inner surrounding wall and the outer surrounding wall are opposite to each other at an interval.

10. An electronic device having a buffering positioning mechanism, comprising:
    a casing, comprising two shells fixed by at least one fixing element only between the two shells, the two shells respectively having two inner walls opposite each other;
    an internal module, having two outer walls opposite each other, comprising a carrier and a plurality of internal components of the electronic device provided on the carrier, the internal module accommodated in the casing; and
    at least one buffer member, supporting between at least one of the inner walls and at least one of the outer walls that are opposite each other;
    wherein the at least one buffer member supports between one of the inner walls and one of the outer walls that are opposite each other, and one other of the outer walls of the internal module abuts against one other of the inner walls of the casing.

11. The electronic device having a buffering positioning mechanism according to claim 10, wherein at least one interval space is formed between the internal module and the casing, a shape of the at least one buffer member corresponds to a shape of the at least one interval space, and the at least one buffer member fills in the at least one interval space.

12. The electronic device having a buffering positioning mechanism according to claim 10, wherein the at least one buffer member is in a quantity of two, and the buffer members respectively support between the inner walls and the outer walls opposite each other.

13. The electronic device having a buffering positioning mechanism according to claim 10, further comprising:

a positioning structure, provided at one of the inner walls;

wherein the internal module is provided with a corresponding positioning structure, the positioning structure mutually couples the corresponding positioning structure to position the internal module at a predetermined position in the casing.

14. The electronic device having a buffering positioning mechanism according to claim 13, wherein the positioning structure and the corresponding positioning structure respectively comprise at least two positioning columns and at least two positioning holes, and the positioning columns are correspondingly inserted into the positioning holes.

15. The electronic device having a buffering positioning mechanism according to claim 13, wherein the two inner walls are respectively a first inner wall and a second inner wall, the two outer walls are respectively a first outer wall and a second outer wall, the first inner wall and the first outer wall are opposite each other at an interval, the positioning structure protrudes from the first inner wall towards a direction of the first outer wall, and the corresponding positioning structure is recessed from the first outer wall towards a same direction.

16. The electronic device having a buffering positioning mechanism according to claim 14, wherein the positioning structure further comprises at least one positioning rib, the at least one positioning rib protrudes from the first inner wall towards a direction of the first outer wall by a predetermined protruding length, and the at least one positioning rib abuts against the first outer wall of the internal module by the predetermined protruding length.

17. The electronic device having a buffering positioning mechanism according to claim 13, wherein the plurality of internal components comprises a predetermined exposed component, the casing is provided with an opening, the predetermined exposed component is, through the internal module positioned at the predetermined position in the casing by the positioning structure and the corresponding positioning structure, exposed through the opening.

18. The electronic device having a buffering positioning mechanism according to claim 10, wherein the casing further comprises an inner surrounding wall connecting between peripheries of the two inner walls, the internal module further comprises an outer surrounding wall connecting between peripheries of the two outer walls, and the inner surrounding wall and the outer surrounding wall are opposite to each other at an interval.

* * * * *